(12) United States Patent
Lin et al.

(10) Patent No.: US 8,373,189 B2
(45) Date of Patent: Feb. 12, 2013

(54) LIGHT EMITTING DIODE PACKAGE

(75) Inventors: Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/290,145

(22) Filed: Nov. 7, 2011

(65) Prior Publication Data
US 2012/0235194 A1    Sep. 20, 2012

(30) Foreign Application Priority Data

Mar. 17, 2011  (CN) .......................... 2011 1 0064731

(51) Int. Cl.
*H01L 33/60* (2010.01)
(52) U.S. Cl. .................................. 257/98; 257/E33.066
(58) Field of Classification Search .................. 257/98, 257/E33.066
See application file for complete search history.

(56) References Cited

U.S. PATENT DOCUMENTS
6,874,910 B2 * 4/2005 Sugimoto et al. ............. 362/294

* cited by examiner

*Primary Examiner* — Calvin Lee
*Assistant Examiner* — Monica D Harrison
(74) *Attorney, Agent, or Firm* — Altis Law Group, Inc.

(57) ABSTRACT

An LED package includes an insulated frame, a first metallic conductor and a second metallic conductor, a chip and an encapsulation. The insulated frame has a receiving groove defined therein. The two metallic conductors are both mounted on bottom of the insulated frame and separated from each other. The chip is placed in the receiving groove and electrically connected to the two metallic conductors. The encapsulation is located in the receiving groove. The first metallic conductor and the second metallic conductor each comprise a mounting portion exposed to the receiving groove and a reflecting portion extending from the mounting portion into the insulated frame. The first reflecting portion and the second reflecting portion cooperatively surround the receiving groove of the insulated frame.

13 Claims, 6 Drawing Sheets

LIGHT EMITTING DIODE PACKAGE

BACKGROUND

1. Technical Field

The present disclosure generally relates to light emitting diode (LED) packages.

2. Description of Related Art

In recent years, light emitting diodes (LEDs) have become more and more popular, due to their low power-consumption, energy saving properties, high efficiency, short reactive time and long life. Furthermore, LEDs contain no mercury. A typical PLCC (Plastic Leaded Chip Carrier) LED includes a radiation emitting semiconductor chip, an encapsulation covers on the radiation emitting semiconductor chip, and a reflector surrounding the chip and the encapsulation for reflecting light from the chip. The reflector is usually made of polyphthalamide (PPA); a part of light beams from the radiation emitting semiconductor chip may transmit through the reflector, rather than reflected by the reflector; thus, the luminous efficiency of the LED is depressed.

Therefore, it is necessary to provide an LED package overcoming the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED package in detail.

Figure 1:
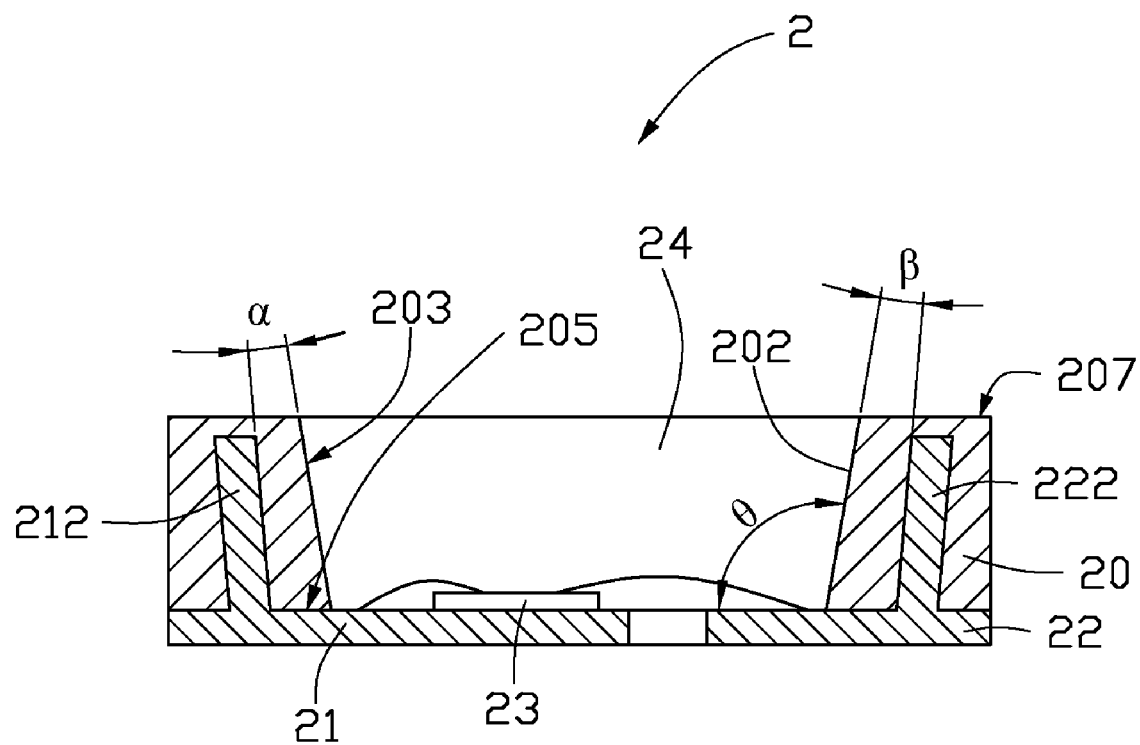
FIG. 1 is a schematic, cross-sectional view of an LED package in accordance with a first embodiment of the present disclosure.
Figure 2:
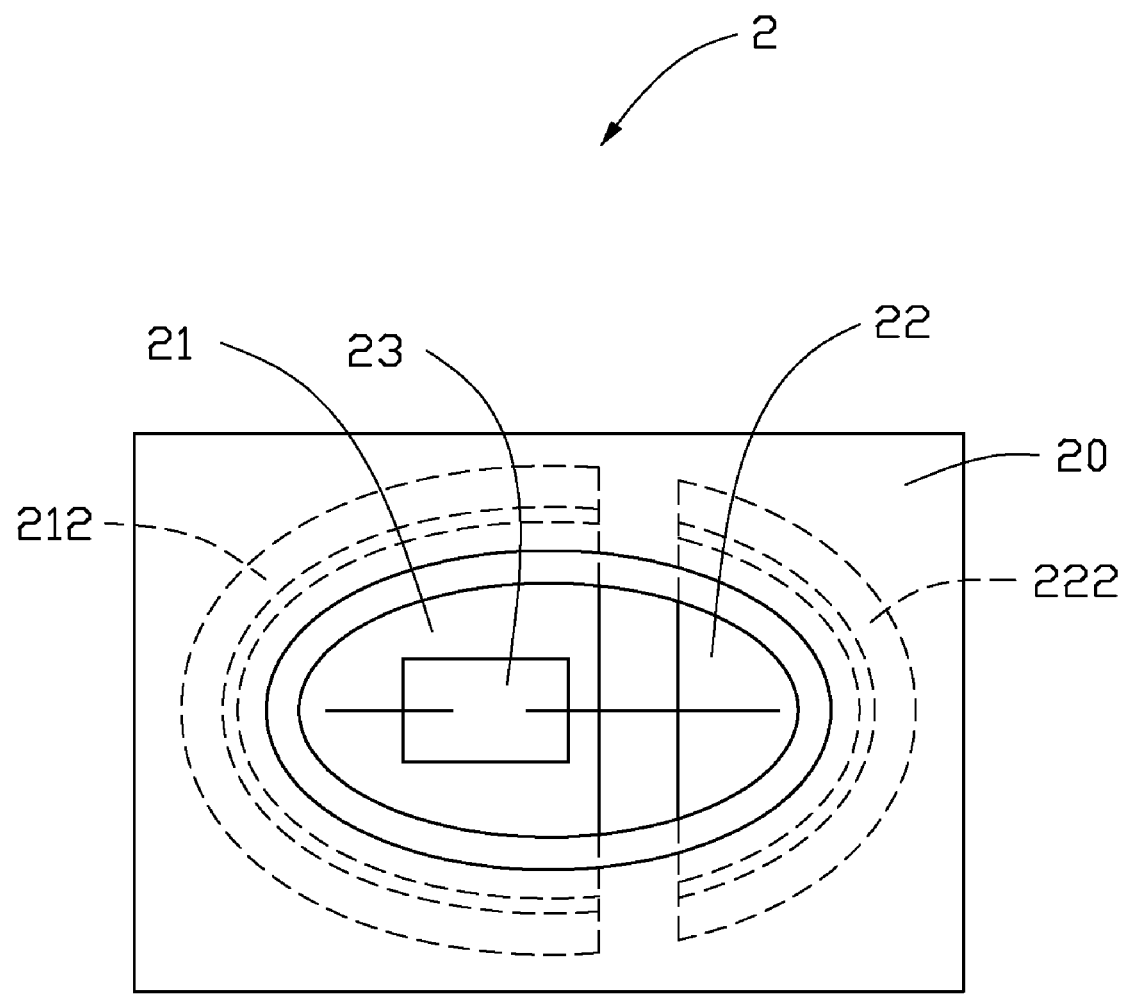
FIG. 2 is a schematic top view of the LED package of FIG. 1.
Figure 3:
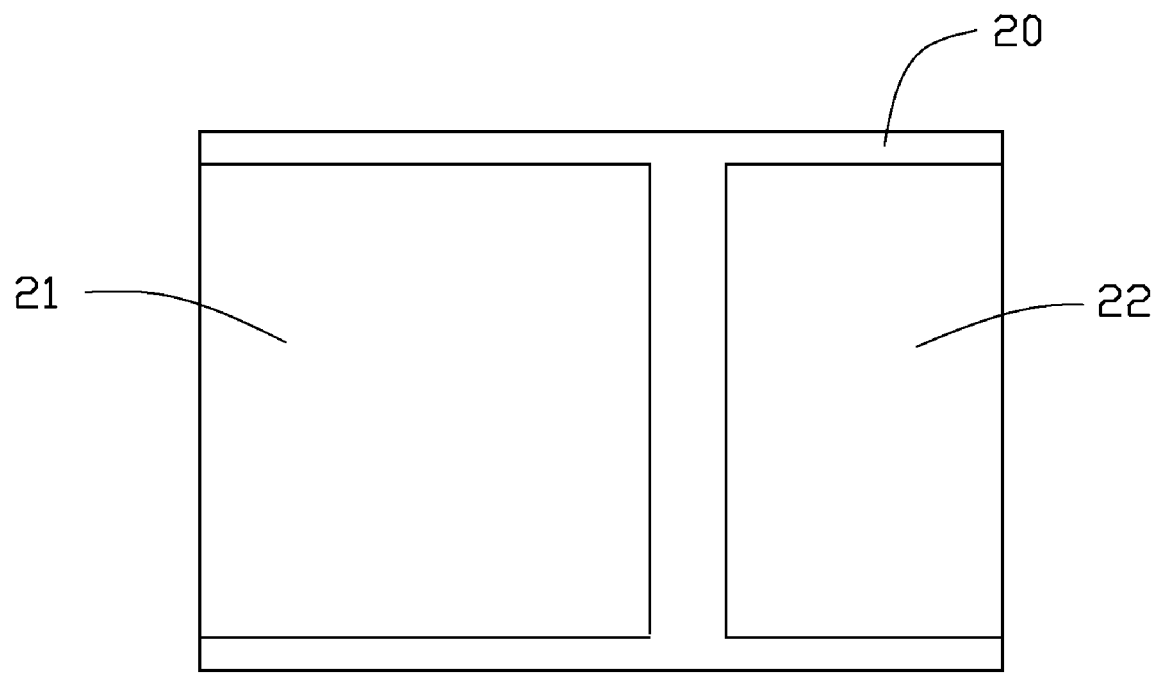
FIG. 3 is a schematic bottom view of the LED package of FIG. 1.

Referring to FIGS. 1-3, an LED package 2 according to a first embodiment includes an insulated frame 20, a first metallic conductor 21, a second metallic conductor 22, a radiation emitting semiconductor chip 23 and an encapsulation 24.

The insulated frame 20 is generally cylinder-shaped, and defines a receiving groove 202 therein. An inner side surface 203 of the frame 20 surrounding the receiving groove 202 is angled with respect to a bottom surface 205 of the frame 20. An angle θ of inclination of the side surface 203 with respect to the bottom surface 205 is configured to be in a predetermined range, wherein 90 degrees<θ≦120 degrees.

The first metallic conductor 21 and the second metallic conductor 22 are respectively mounted on the bottom surface 205 of the frame 20 and located at two opposite sides of the receiving groove 202. The first metallic conductor 21 and the second metallic conductor 22 each have a semi-elliptical profile, and they are separated from each other. In addition, the first metallic conductor 21 and the second metallic conductor 22 both extend into the bottom of the receiving groove 202. In other words, both of the first and second metallic conductors 21, 22 are exposed in the groove 202. The first and second metallic conductors 21, 22 are made of metal with high electrical conductivity, such as gold (Au), silver (Ag), copper (Cu), or an alloy thereof.

The radiation emitting semiconductor chip 23 is located in the receiving groove 202 and electrically connected to the first metallic conductor 21 and the second metallic conductor 22. In the present embodiment, the radiation emitting semiconductor chip 23 is mounted on the exposed part of the first metallic conductor 21 and electrically connected to the first and second metallic conductors 22 by metal wires (such as gold wires, not labeled). The first and second metallic conductors 21, 22 can facilitate supply of power from an external apparatus (not shown) to the radiation emitting semiconductor chip 23.

The first metallic conductor 21 has a first reflecting portion 212 extending into the insulated frame 20, and the second metallic conductor 22 has a second reflecting portion 222 extending into the insulated frame 20. The first reflecting portion 212 and the second reflecting portion 222 both are substantially semi-elliptical rings. The first reflecting portion 212 is located opposite to the second reflecting portion 222 and cooperates with the second reflecting portion 212 to surround the receiving groove 202, to prevent light beams from the radiation emitting semiconductor chip 23 from transmitting through the insulated frame 20. Thus, the luminous efficiency of LED package 2 can be improved. In the present embodiment, the first reflecting portion 212 and the second reflecting portion 222 both have curved configuration and arranged adjacent to the inner side surface 203, resulting in that light beams from the radiation emitting semiconductor chip 23 and transmitting through the side surface 203 into the insulated frame 20 can be reflected back to the receiving groove 202 by the first and second reflecting portions 212, 222. Thus, loss of light intensity can be decreased.

An angle α between the side surface 203 and the first reflecting portion 212 is configured to be in a predetermined range, wherein 0 degree≦α≦30 degrees, preferably 0 degree≦α≦15 degrees, so that to improve the reflection efficiency of the first reflecting portion 212. When the first reflecting portion 212 is parallel to the side surface 203 of the receiving groove 202, wherein α=0 degree, light beams from the radiation emitting semiconductor chip 23 can be reflected uniformly by the first reflecting portion 212, whereby the luminous efficiency of LED package 2 can be improved.

An angle β between the side surface 203 and the second reflecting portion 222 is configured to be in a predetermined range, wherein 0 degree≦β≦30 degrees, preferably 0 degree≦β≦15 degrees, so that to improve the reflection efficiency of the second reflecting portion 222. When the second reflecting portion 222 is parallel to the side surface 203 of the receiving groove 202, wherein β=0 degree, light beams from the radiation emitting semiconductor chip 23 can be reflected uniformly by the second reflecting portion 222, whereby the luminous efficiency of LED package 2 can be improved.

It can be understood that, the angles α and β may be same or different, but curvatures of the first and second reflecting portion 212, 222 are preferably consistent with that of the side surface 203 of the receiving groove 202. Furthermore, the first reflecting portion 212 and the second reflecting portion 222 may extend onto a top surface 207 of the insulated frame 20, to enhance the reflection efficiency for the light beams from the radiation emitting semiconductor chip 23 and ensure that light beams from the radiation emitting semiconductor chip 23 may not transmit through the insulated frame 20.

The encapsulation 24 is placed in the receiving groove 202 to encapsulate the radiation emitting semiconductor chip 23. The encapsulation 24 is configured for optically adjusting (e.g., diverging or converging) a direction of the light emitted from the radiation emitting semiconductor chip 23, thus adjusting an illuminating scope of the LED package 2. In addition, the encapsulation 24 protects the radiation emitting semiconductor chip 23 from contaminants.

Figure 4:
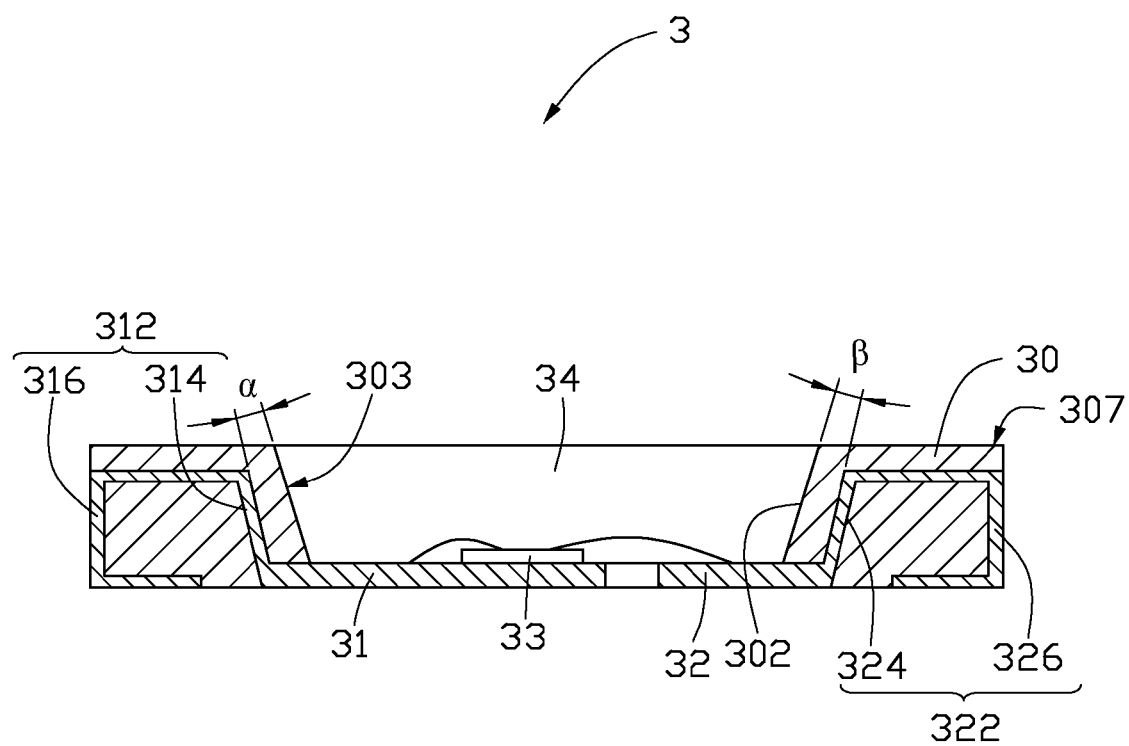
FIG. 4 is a schematic, cross-sectional view of an LED package in accordance with a second embodiment of the present disclosure.
Figure 5:
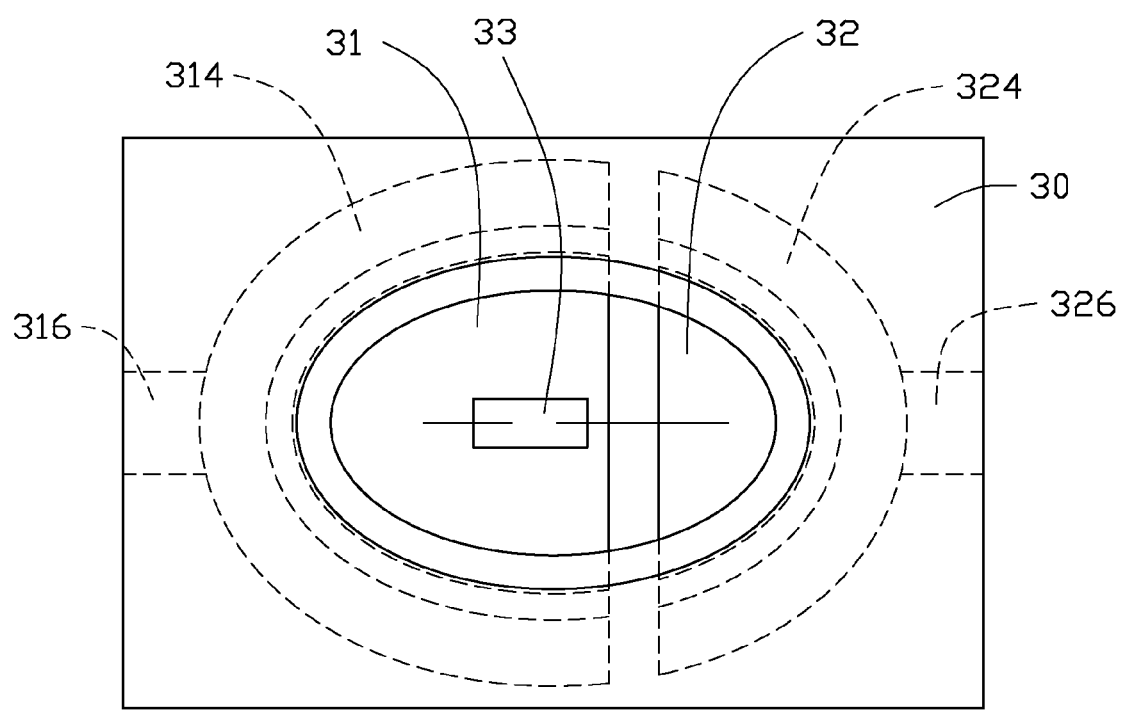
FIG. 5 is a schematic top view of the LED package of FIG. 4.
Figure 6:
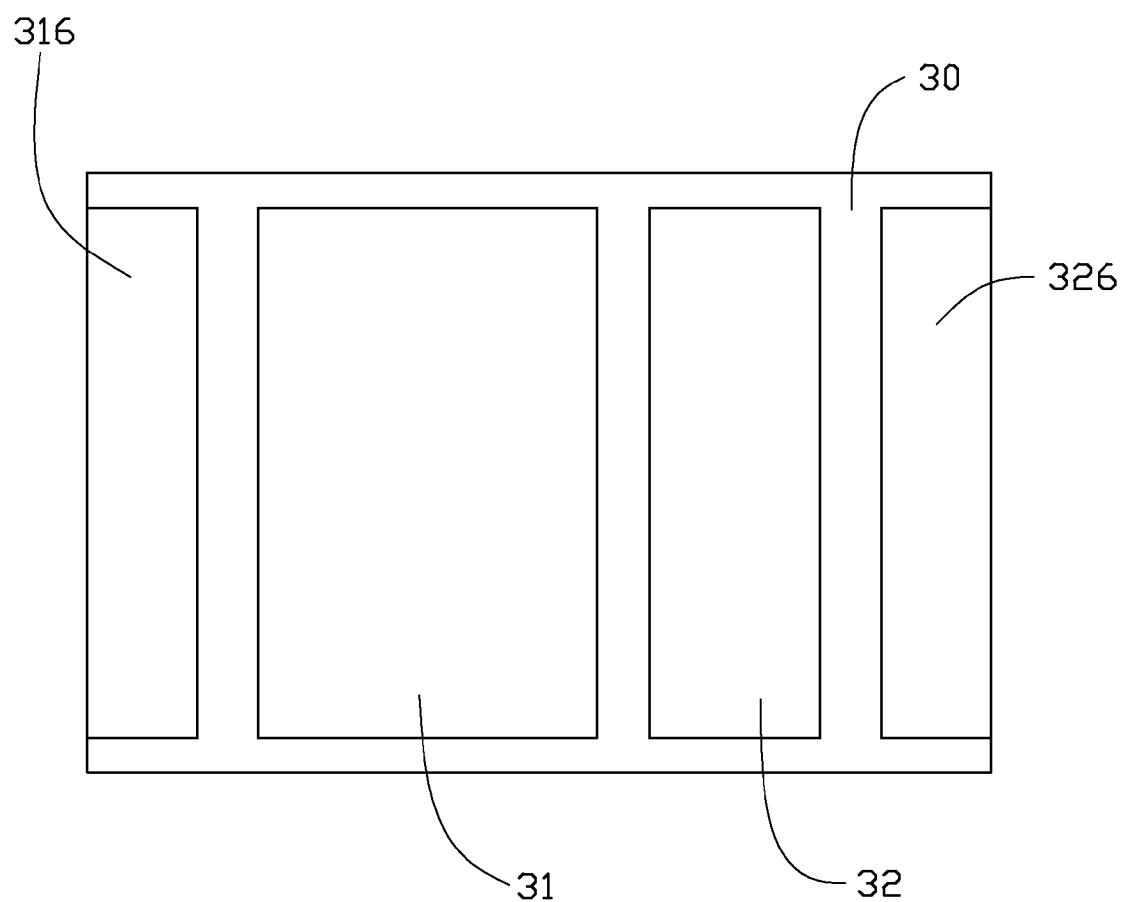
FIG. 6 is a schematic bottom view of the LED package of FIG. 4.

Referring to FIGS. 4-6, except the difference disclosed herebelow, an LED package 3 in accordance with a second embodiment of the present invention is similar with the first embodiment.

A first metallic conductor 31 of the LED package 3 includes a first reflecting portion 312, and the first reflecting portion 312 includes a first extending portion 314 adjacent to the side surface 303 of the receiving surface 303 and a second extending portion 316 connecting a top terminal of the first extending portion 314 and exposed to an outside of the insulated frame 30. The connection of the first extending portion 314 and the second extending portion 316 is embedded in the insulated frame 30. An angle α between the first extending portion 314 and the side surface 303 of the receiving groove 302 is configured to be in a predetermined range, wherein 0 degree≦α≦30. When the first extending portion 314 is parallel to the side surface 303 of the receiving groove 302, and light beams from the radiation emitting semiconductor chip 33 can be reflected uniformly by the first extending portion 314, whereby the luminous efficiency of LED package 3 can be improved. The exposed part of the second extending portion 316 facilitates connection of the first metallic conductor 31 with an external apparatus (such as a circuit board, not shown) and increase a bonding strength therebetween.

In a modification (not shown), the first reflecting portion 312 and the second reflecting portion 322 may extend onto a top surface 307 of the insulated frame 30. Advantageously the connection between the first extending portion 314 and the second extending portion 316 is on the top surface 307 of the insulate frame 30, and the connection between a first extending portion 324 and a second extending portion 326 of the reflecting portion 322 is on the top surface 307 of the insulate frame 30 to enhance the reflection efficiency for the light beams from the radiation emitting semiconductor chip 33. Furthermore, light beams from the radiation emitting semiconductor chip 33 are ensured to not to transmit through the insulated frame 30.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
   an insulated frame having a receiving groove defined therein;
   a first metallic conductor and a second metallic conductor both mounted on a bottom of the receiving groove of the insulated frame and separated from each other, the first metallic conductor and the second metallic conductor both extending into the bottom of the receiving groove;
   a radiation emitting semiconductor chip placed in the receiving groove of the insulated frame and electrically connected to the first metallic conductor and the second metallic conductor;
   an encapsulation located in the receiving groove of the insulated frame for sealing the radiation emitting semiconductor chip;
   wherein the first metallic conductor comprises a first protrusion extended in the insulated frame at position near the receiving groove, the second metallic conductor comprises a second protrusion opposite to the first protrusion, and the first protrusion and the second protrusion cooperatively surround the receiving groove of the insulated frame for reflecting light beams form the radiation emitting semiconductor chip.

2. The LED package according claim 1, wherein an angle between an inner side surface of the insulated frame defining the receiving groove and at lease one of the first protrusion and the second protrusion ranges from 0 degree to 30 degrees.

3. The LED package according claim 2, wherein at lease one of the first protrusion and the second protrusion is parallel to the inner side surface of the insulated frame defining the receiving groove.

4. An LED package comprising:
   an insulated frame having a receiving groove defined therein;
   a first metallic conductor configured for electrically connecting with an external device, comprising a first mounting portion exposed to the receiving groove and a first reflecting portion extending from the first mounting portion into the insulated frame;
   a second metallic conductor configured for electrically connecting with the external device, comprising a second mounting portion exposed to the receiving groove and a second reflecting portion extending from the second mounting portion into the insulated frame, the second mounting portion being spaced from the first mounting portion, the first reflecting portion and the second reflecting portion cooperatively surrounding the receiving groove of the insulated frame;
   a radiation emitting semiconductor chip located in the receiving groove of the insulated frame and electrically connected to the first mounting portion of the first metallic conductor and the second mounting portion of the second metallic conductor; and
   an encapsulation filled in the receiving groove of the insulated frame and encapsulating the radiation emitting semiconductor chip.

5. The LED package according claim 4, wherein a first angle between an inner side surface of the insulated frame defining the receiving groove and the first reflecting portion ranges from 0 degree to 30 degrees.

6. The LED package according claim 5, wherein the first angle is in a range from 0 degree to 15 degrees.

7. The LED package according claim 5, wherein the first reflecting portion of the first metallic conductor comprises a first extending portion embedded in the insulated frame and a second extending portion extending to an outside of the insulated frame, the second extending portion covering a lateral side surface of the insulated frame, the first angle being defined between the inner side surface of the insulated frame and the first extending portion.

8. The LED package according claim 7, wherein the first angle is 0 degree and the first extending portion is parallel to the inner side surface.

9. The LED package according claim 4, wherein a second angle between an inner side surface of the insulated frame defining the receiving groove and the second reflecting portion is in a range from 0 degree to 30 degrees.

10. The LED package according claim 9, wherein the second angle is in a range from 0 degree to 15 degrees.

11. The LED package according claim 9, wherein the second reflecting portion of the second metallic conductor comprises a first extending portion embedded in the insulated frame and a second extending portion extending to an outside of the insulated frame, the second extending portion covering a lateral side surface of the insulated frame, the second angle being defined between the inner side surface of the insulated frame and the first extending portion.

12. The LED package according claim 11, wherein the second angle is 0 degree and the first extending portion of the second reflecting portion is parallel to the inner side surface.

13. The LED package according claim 4, wherein at lease one of the first reflecting portion and the second reflecting portion is parallel to an inner side surface of the insulated frame defining the receiving groove.

\* \* \* \* \*